(12) United States Patent
Paek (10) Patent No.: US 7,808,105 B1
(45) Date of Patent: Oct. 5, 2010

(54) SEMICONDUCTOR PACKAGE AND FABRICATING METHOD THEREOF

(75) Inventor: Jong Sik Paek, Seoul (KR)

(73) Assignee: Amkor Technology, Inc., Chandler, AZ (US)

( * ) Notice: Subject to any disclaimer, the term of this patent is extended or adjusted under 35 U.S.C. 154(b) by 161 days.

(21) Appl. No.: 11/734,999

(22) Filed: Apr. 13, 2007

(51) Int. Cl.
*H01L 23/52* (2006.01)
*H01L 21/28* (2006.01)

(52) U.S. Cl. .................. 257/750; 257/780; 438/598

(58) Field of Classification Search ......... 257/758–780, 257/E21.526; 438/598
See application file for complete search history.

(56) References Cited

U.S. PATENT DOCUMENTS

| | | | |
|---|---|---|---|
| 6,607,938 B2 * | 8/2003 | Kwon et al. ............... 438/109 |
| 7,208,825 B2 * | 4/2007 | Pu et al. .................... 257/686 |
| 7,285,864 B2 * | 10/2007 | Takyu et al. ............... 257/777 |
| 7,368,374 B2 * | 5/2008 | Chia et al. ................. 438/613 |
| 2002/0074637 A1 * | 6/2002 | McFarland .................. 257/686 |

* cited by examiner

*Primary Examiner*—Howard Weiss
*Assistant Examiner*—Steven H Rao
(74) *Attorney, Agent, or Firm*—Gunnison, McKay & Hodgson, L.L.P.; Serge J. Hodgson (57) ABSTRACT

A semiconductor package includes a first semiconductor die; a first redistribution layer coupled to a bonding pad of the first semiconductor die; a first solder bump coupled to the first redistribution layer; a second semiconductor die; a second redistribution layer coupled to a bonding pad of the second semiconductor die; a second solder bump coupled to the second redistribution layer and to the first solder bump; a third redistribution layer coupled to the second redistribution layer; and a solder ball coupled to the third redistribution layer.

18 Claims, 11 Drawing Sheets

SEMICONDUCTOR PACKAGE AND FABRICATING METHOD THEREOF

BACKGROUND OF THE INVENTION

1. Field of the Invention

The present invention relates to a semiconductor package and fabricating method thereof.

2. Description of the Related Art

The semiconductor package is developing from DIP (Dual Inline Package) and PGA (Pin Grid Array) of plated-through package to QFP (Quad Flat Package) and SOP (Small Outline Package) of the SMT (Surface-mount technology) package in small size which has a superior electrical performance, then to TQFP (Thin Quad Flat Package) and TSOP (Thin Small Outline package). Since the middle of the 1990's, such a SMT package of light and thin is developed to the package of BGA (Ball Grid Array) type that has the strong points of the Solder Flip Chip and the SMT technology, it takes new heights of the package technology of new solder ball connection.

Since the latter half of the 1990's, the semiconductor package is developing to a CSP (Chip Scale Package) type which improves the size and electrical performance of the BGA (Ball Grid Array). The CSP technology is a high-density package in which chip size is over 80% of the package size, and the CSP technology is becoming necessary package part in the downsizing electronic products. The individual chip package is developing to the system package of MCM (Multi-Chip Module), SIP (System In Package) or SOP (System On Package) type.

However, it is very difficult to use the system package at high frequency, because the resistance component is large and the cross talk between wiring patterns is serious.

The technology for stacking a plurality of semiconductor chip is developing to solve such problems. The chip stack technology is capable of stacking logic chips and memory chips in the vertical direction so that various functions of semiconductor chips can be accumulated in a narrow space. However, it is difficult to use the chip stack technology in the area of high frequency since the conductive wire is used as the wire interconnection method.

Besides, a conventional connection mode of such as a wire bonding and TAB (Tape Automated Bonding) reached limits of improving the electrical function and reducing the system size. Therefore, a new interconnection technology of DCA (Direct Chip Attach) technology utilizing the through silicon via technology is now developing. Such a DCA technology in which the resistance or various parasitic capacitances is little and the cross talk phenomenon is rare because of shortness in the length of a signal line has a strong point, so that it is very easy to apply to the high frequency domain.

However, the DCA technology using through silicon via technology is difficult to form the through silicon via in the semiconductor chip, and to fill copper metal into the through silicon via, which brings the problem of reducing throughput. The semiconductor chip itself cracks since copper metal swells by the heat generated during the operation of the semiconductor chip.

SUMMARY OF THE INVENTION

In accordance with one embodiment, a semiconductor package includes a first semiconductor die; a first redistribution layer coupled to a bonding pad of the first semiconductor die; a first solder bump coupled to the first redistribution layer; a second semiconductor die; a second redistribution layer coupled to a bonding pad of the second semiconductor die; a second solder bump coupled to the second redistribution layer and to the first solder bump; a third redistribution layer coupled to the second redistribution layer; and at least one solder ball coupled to the third redistribution layer. The semiconductor package of low cost and good throughput is provided by not using forming process of through silicon via in high accuracy.

Embodiments in accordance with the present invention will be more apparent from the following detailed description taken in conjunction with the accompanying drawings.

BRIEF DESCRIPTION OF THE DRAWINGS

Common reference numerals are used throughout the drawings and the detailed description to indicate the identical elements.

DETAILED DESCRIPTION

Figure 1:
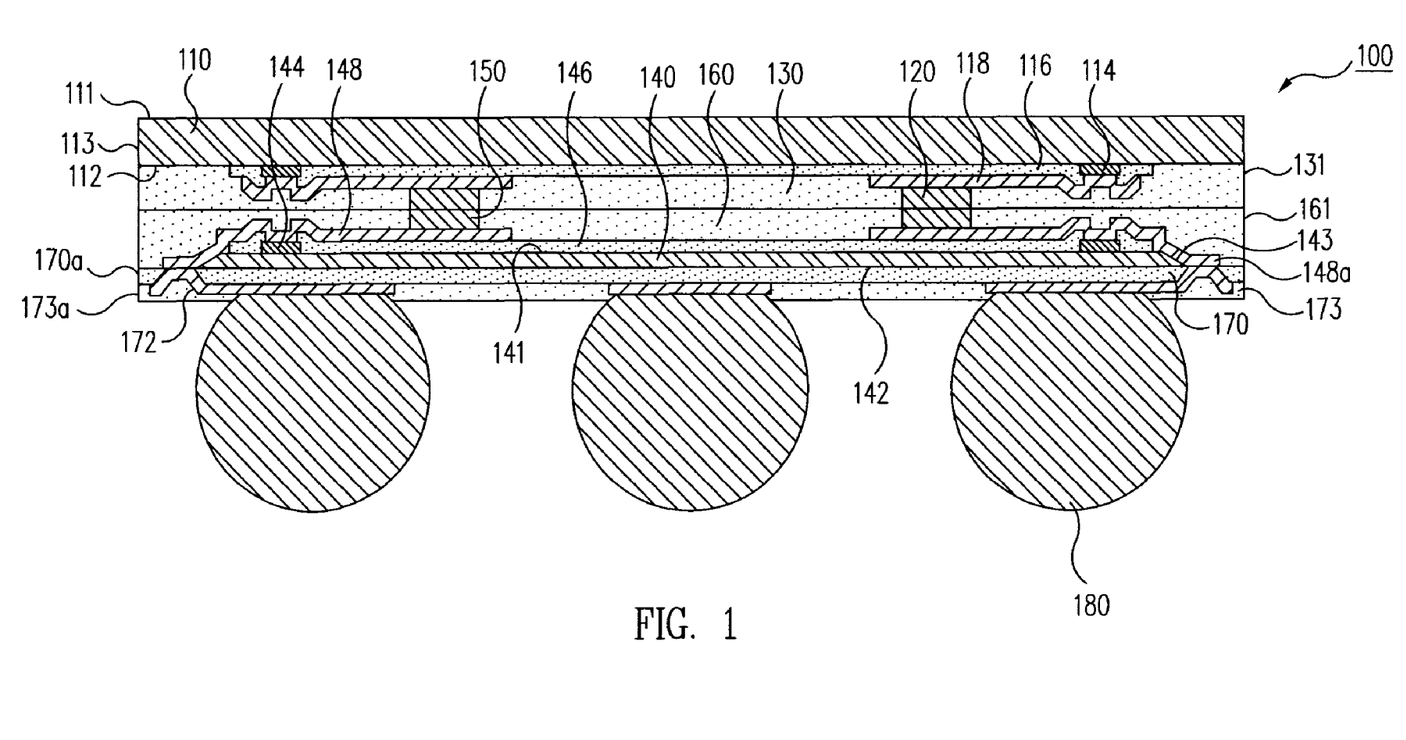
FIG. 1 is a cross sectional view illustrating a semiconductor package according to the present invention.

FIG. 1 illustrates a cross sectional view of a semiconductor package according to the present invention.

As illustrated in FIG. 1, the semiconductor package 100 according to the present invention includes a first semiconductor die 110 including a bonding pad 114, a first insulating passivation layer 116 formed on the external side of the bonding pad 114, a first redistribution layer 118 coupled to the bonding pad 114, a first solder bump 120 coupled to the redistribution layer 118, a first dielectric layer 130 covering the redistribution layer 118, a second semiconductor die 140 with a bonding pad 144, a second insulating passivation layer 146 formed on the external side of the bonding pad 144, a second redistribution layer 148 coupled to the bonding pad 144, a second solder bump 150 coupled to the second redistribution layer 148, a second dielectric layer 160 formed over the second redistribution layer 148, a third dielectric layer 170 formed on the second semiconductor die 140, a third redistribution layer 172 coupled to the second redistribution layer 148, a fourth dielectric layer 173 formed over the third redistribution layer 172, and a solder ball 180 coupled to the third redistribution layer 172.

The first semiconductor die 110 has a first surface 111 which is approximately flat or completely flat, and a second surface 112 which is approximately flat or completely flat as an opposite side of the first surface 111. A third surface 113 connected between the first surface 111 and the second surface 112 is formed in the direction of right-angle thereto. At least one of bonding pad 114 is formed on the second surface 112 of the first semiconductor die 110.

The first insulating passivation layer 116 plays a role of protecting the second surface 112 of the first semiconductor die 110 in which an active area is formed, by covering the second surface 112 of the external side of the bonding pad 114. The first insulating passivation layer 116 is one selected from typical oxide film, nitride film, polyimide, and its equivalent, the material is not limited thereto.

The first redistribution layer 118 is coupled to the bonding pad 114, and is prolonged in a predetermined length on the surface of the insulating passivation layer 116. The first redistribution layer 118 as a combination of various metal layers is called UBM (Under Bumped Metallurgy), and the united type of the metal layer is various. For example, copper for a solder adhesive layer, and titanium Ti, nickel Ni, palladium Pd and so on for a barrier layer are used in the first redistribution layer 118, the metal material is not limited thereto.

The first solder bump 120 is coupled to the first redistribution layer 118. The first solder bump 120 can be formed using one selected from typical Pb/Sn, leadless Sn, and its equivalent, the material is not limited thereto.

The second surface 112 of the first semiconductor die 110 is covered with the first dielectric layer 130. The first insulating passivation layer 116 and first redistribution layer 118 are covered with the first dielectric layer 130. The first dielectric layer 130 covers all the side surfaces except for the lower side of the first solder bump 120. The first dielectric layer 130 also covers the first insulating passivation layer 116 and the second surface 112 of the first semiconductor die 110 in which the first redistribution layer 118 is not formed. A side surface 131 configuring the identical plane with the third surface 113 of the first semiconductor die 110 is formed in the dielectric layer 130.

The second semiconductor die 140 has a first surface 141 which is approximately flat or completely flat, a second surface 142 which is approximately flat or completely flat as an opposite side of the first surface 141. A third surface 143 connected between the first surface 141 and the second surface 142 is formed in the slanting direction to them. For example, the length of the first surface 141 is shorter than that of the second surface 142 of the second semiconductor die 140, which means the length of the second surface 142 is longer than that of the first surface 141, because the third surface 143 is inclined. Further, the width of the second semiconductor die 140 is smaller than that of the first semiconductor die 110. At least one of bonding pad 144 is formed on the first surface 141 of the second semiconductor die 140.

The second insulating passivation layer 146 plays a role of protecting the first surface 141 of the second semiconductor die 140 in which an active area is formed, by covering the first surface 141 approximately of the external side of the bonding pad 144. The second insulating passivation layer 146 is one selected from typical oxide film, nitride film, polyimide, and its equivalent, the material is not limited thereto.

The second redistribution layer 148 coupled to the bonding pad 144 has a prolonged shape in a predetermined length on the surface of the second insulating passivation layer 146, the first flat surface 141, and the third inclined surface 143. The second redistribution layer 148 has an extension pattern 148a extended to the outer area of the third surface 143 of the second semiconductor die 140 in a predetermined length. The second redistribution layer 148 as a combination of various metal layers is called UBM (Under Bumped Metallurgy), and the united type of the metal layer is various. For example, copper Cu for a solder adhesive layer, and titanium Ti, nickel Ni, palladium Pd and so on for a barrier layer are used in the second redistribution layer 148, the metal material is not limited thereto.

The second solder bump 150 is coupled to the second redistribution layer 148 and the second solder bump 150 is coupled to the solder bump 120. Accordingly, the first semiconductor die 110 and the second semiconductor die 140 can be connected mutually. The conductive path is formed through the bonding pad 114 of the first semiconductor die 110, the first redistribution layer 118, the first solder bump 120, the second solder bump 150, the second redistribution layer 148 and the bonding pad 144 of the second semiconductor die 140. The second solder bump 150 can be formed using one selected from typical Pb/Sn, leadless Sn, and its equivalent, the material is not limited thereto.

The first surface 141 and the third surface 143 of the second semiconductor die 140 is covered with the second dielectric layer 160 which means that the second insulating passivation layer 146 and the second redistribution layer 148 are covered with the second dielectric layer 160. The second dielectric layer 160 covers all the side surfaces except for the upper side of the second solder bump 150. The second dielectric layer 160 sticks to the first dielectric layer 130 closely which means that the second dielectric layer 160 attaches to the first dielectric layer 130 physically. The second dielectric layer 160 further includes the side surface 161 configuring the identical plane with the side surface 131 of the first dielectric later 130. Accordingly, the identical flat plane is realized in the side surface 131 of the first dielectric layer 130, the side surface 161 of the second dielectric layer 160, and the third surface 113 of the first semiconductor die 110.

The third dielectric layer 170 is formed on the second surface 142 of the second semiconductor die 140. The third dielectric layer 170 plays a role of preventing the generation of leakage current when the third redistribution layer 172 is electrically shorted in the unwanted area of the second semiconductor die 140. The second semiconductor die 140 has some degree of conductive property due to doping in the impurity of a P or N type. Accordingly, if the third redistribution layer 172 is formed directly on the surface of the second semiconductor die 140 directly without forming the third dielectric layer 170 on the second semiconductor die 140, the leakage current can be generated.

The third redistribution layer 172 is coupled to the extension pattern 148a of the second redistribution layer 148. The third redistribution layer 172 is coupled to the first semiconductor die 110 and the second semiconductor die 140. The third redistribution layer 172 is mainly disposed on the third dielectric layer 170. The third redistribution layer 172 as a combination of various metal layers is called UBM (Under Bumped Metallurgy), and the united type of the metal layer is various. For example, copper Cu for a solder adhesive layer, and titanium Ti, nickel Ni, palladium Pd and the like for a barrier layer are used in the third redistribution layer 172, the metal material is not limited thereto.

The fourth dielectric layer 173 covers surfaces of the third dielectric layer 170 and the third redistribution layer 172 which is the external side of the solder ball 180. The third distribution layer 172 is isolated from the exterior circumstances and protected safely.

The solder ball 180 is coupled to the third redistribution layer 172. The solder ball 180 is melted and attached to the third redistribution layer 172. The solder ball 180 is also arrayed in the area against the second surface 142 of the second semiconductor die 140 since the third redistribution layer 172 is arrayed in the area against the second surface 142 of the second semiconductor die 140. The solder ball 180 can be formed using one selected from Pb/Sn, leadless Sn, and its equivalent, the material is not limited thereto.

The side surface 170a, 173a of the third dielectric layer 170 and the fourth dielectric layer 173 forms the identical plane with the side surface 131 of the first dielectric 130, the third surface 113 of the first semiconductor die 110 and the side surface 161 of the second layer 160, so it realizes a real chip-size package.

The first solder bump 120 is formed in a position at a predetermined distance away from the bonding pad 114 of the first semiconductor die 110 in the horizontal direction, and the second solder bump 150 is formed in a position at a predetermined distance away from the bonding pad 144 of the second semiconductor die 140 in the horizontal direction. However, the first solder bump 120 can be formed in the opposing position with the bonding pad 114 of the first semiconductor die 110 and the second solder bump 150 can be formed in the opposing position with the bonding pad 144 of the second semiconductor die 140. The parasitic capacitance and resistance becomes less by shortening the conductive path between the first semiconductor die 110 and the second semiconductor die 140 in the semiconductor package.

The length of interconnection becomes short without using the conductive wire in accordance with the present invention. The electrical signal of the first semiconductor die 110 is transmitted to the exterior device through the bonding pad 114, the first redistribution layer 118, the first solder bump 120, the second solder bump 150, the second redistribution layer 148, the third redistribution layer 172, and the solder ball 180. The electrical signals of the exterior devices are transmitted to the first semiconductor die 110 in the reverse order of the sequence. Besides, the electrical signal of the second semiconductor die 140 is transmitted to the exterior device through the bonding pad 144, the second redistribution layer 148, the third redistribution layer 172, and the solder ball 180. The electrical signals of the exterior device are transmitted to the second semiconductor die 140 in the reverse order of the sequence. An embodiment in accordance with the present invention provides a semiconductor package of low cost and good throughput by not using forming process of through silicon via in high accuracy. That is, by forming the third slanting surface 143 in the second semiconductor die 140, and forming the second redistribution layer 148 on the third surface 143, the second redistribution layer 148 enables the electrical signals of the first semiconductor die 110 and second semiconductor die 140 to transmit to the exterior device through the third redistribution layer 172 and solder ball 180. The electrical signals of the exterior device are transmitted to the first semiconductor die 110 and the second semiconductor die 140 in the reverse order of the sequence.

Hereafter, the fabricating method of a semiconductor package will be described below. The semiconductor package in accordance with the present invention is fabricated in a wafer to wafer mode or chip to wafer mode, still the partial area of the wafer (single semiconductor die) is the enlarged view in the drawing.

The fabricating method of a semiconductor package in accordance with the present invention will be described in three parts, that is, a preparing operation of the first semiconductor die, a preparing operation of the second semiconductor die, and a stacking operation of the first and second semiconductor die.

Figure 2:
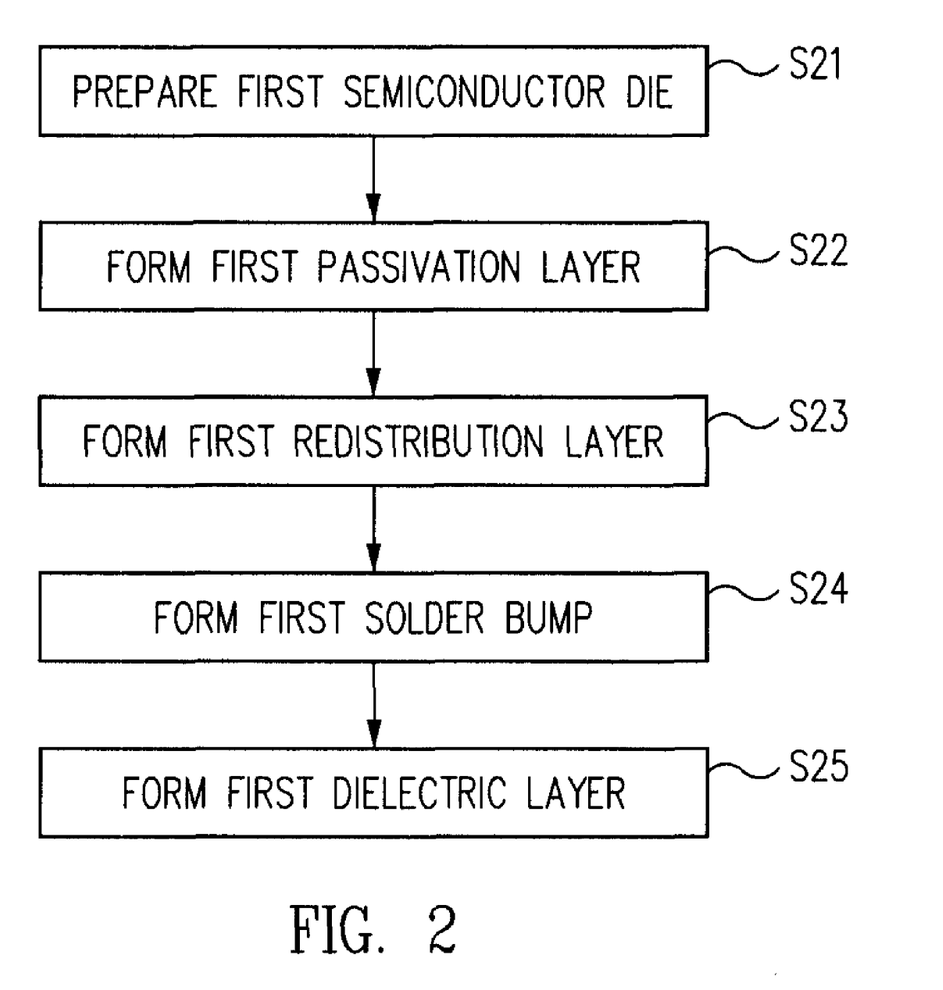
FIG. 2 is a sequential diagram illustrating a preparing operation of a first semiconductor die in a fabricating method of a semiconductor package according to the present invention.

FIG. 2 illustrates the preparing operation of the first semiconductor die in the fabricating method of a semiconductor package according to the present invention.

As illustrated, an embodiment in accordance with the present invention includes an operation S21 of preparing the first semiconductor die, an operation S22 of forming the first passivation layer, an operation S23 of forming the first redistribution layer, an operation S24 of forming the first solder bump, and an operation S25 of forming the first dielectric layer.

Referring to FIGS. 3a to 3e, the fabricating method of a semiconductor package illustrated in FIG. 2 is illustrated as a cross-sectional view.

Figure 3A:
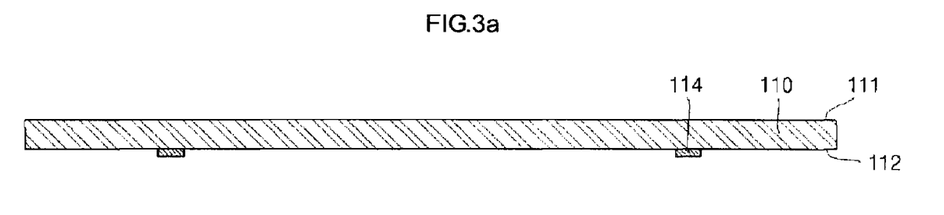
FIGS. 3a to 3e are cross-sectional views illustrating a fabricating method of a semiconductor package illustrated in FIG. 2.

As depicted in FIG. 3a, the operation S21 of preparing the first semiconductor die 110 has the first surface 111 which is approximately flat or completely flat and a second surface 112 which is approximately flat or completely flat as an opposite side of the first surface 111. The second surface 112 prepares the first semiconductor die 110 in which at least one bonding pad 114 formed.

Figure 3B:
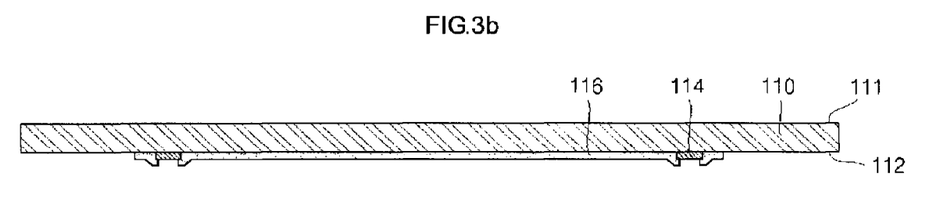

As depicted in FIG. 3b, the operation S22 of forming the first insulating passivation layer is rendered to form the first insulating passivation layer 116 in a predetermined thickness on the second surface 112 of the first semiconductor die 110. The bonding pad 114 is exposed to the outside through the first insulating passivation layer 116. The first insulating passivation layer 116 can be made of one selected from typical oxide film, nitride film, polyimide, and its equivalent, the material is not limited thereto. The nitride film or oxide film is formed to flow the silicon contained gas and nitrogen, the silicon contained gas and oxygen at high temperature.

Figure 3C:
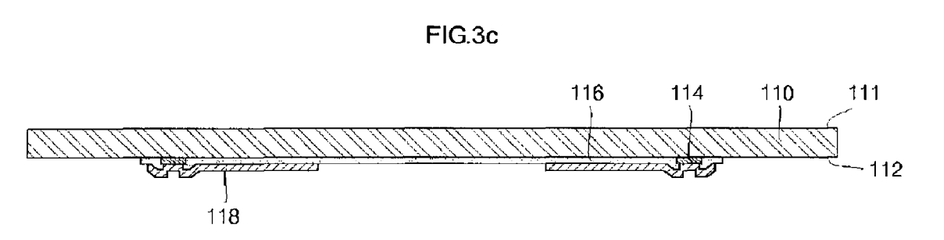

As illustrated in FIG. 3c, the operation S23 of forming the first redistribution layer 118 is rendered to form the first redistribution layer 118 coupled to the bonding pad 114 of the first semiconductor die 110. More specifically, a plurality of metal layers are formed in the entire area facing with the second surface 112 of the first semiconductor die 110 to be coupled to the bonding pad 114 of the first semiconductor die 110 using one selected from the sputtering, plating, and its equivalent method. Hereafter, the first redistribution layer 118 having a predetermined pattern is formed using a typical process of photolithography. A plurality of metal layers is called UBM (Under Bumped Metallurgy), and the united type of the metal layer is various. For example, copper Cu for a solder adhesive layer, and titanium Ti, nickel Ni, palladium Pd and so on for a barrier layer are used in the first redistribution layer 118, the metal material is not limited thereto.

Figure 3D:
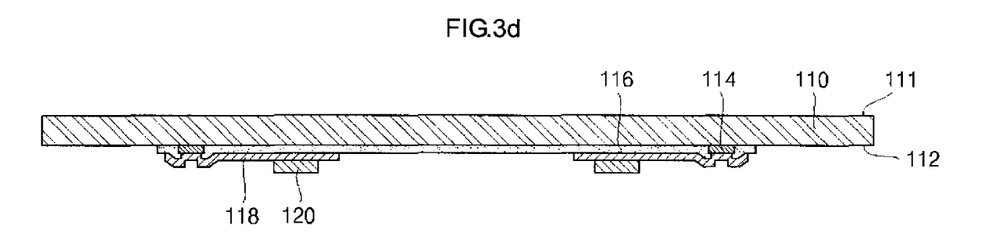

As depicted in FIG. 3d, the first solder bump 120 is formed on the first redistribution layer 118 in the operation S24 of forming the first solder bump. The first solder bump 120 can be formed using one of typical screen printing, plating, and its equivalent method, the method is not limited thereto. The first solder bump 120 can be formed using one selected from typical Pb/Sn, leadless Sn, and its equivalent, the material is not limited thereto.

Figure 3E:
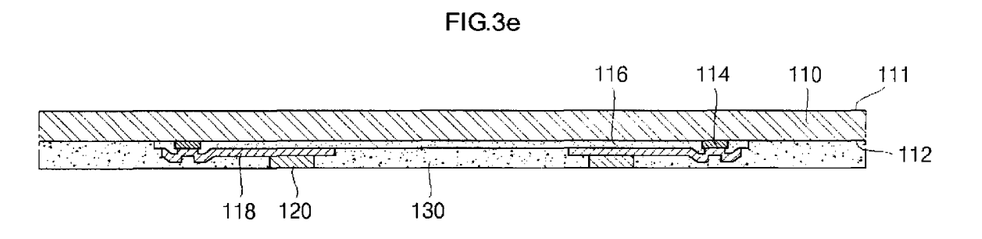

As depicted in FIG. 3e, the second surface 112 of the first semiconductor die 110 is covered with the first dielectric layer 130 in the operation S25 of forming the first dielectric layer. For example, the first dielectric layer 130 can be formed in the opposing area with the second surface 112 of the first semiconductor die 110 using any one of screen printing, spray, spin coating, and its equivalent. The first dielectric layer 130 covers the first redistribution layer 118, the first insulating passivation layer 116 in which the first redistribution layer 118 is not formed, and the second surface 112 in which the first insulating passivation layer 116 and the first redistribution layer 118 is not formed. The lower surface of the first solder bump 120 is exposed to outside through the first dielectric layer 130 and the first dielectric layer 130 uses the material of B-stage state, e.g., B-stage epoxy, which is not completely hardened. Likewise, the reason for using the first dielectric layer 130 of B-stage is that the first dielectric layer 130 sticks strongly to the second dielectric layer 160 by the cure process later.

Figure 4:
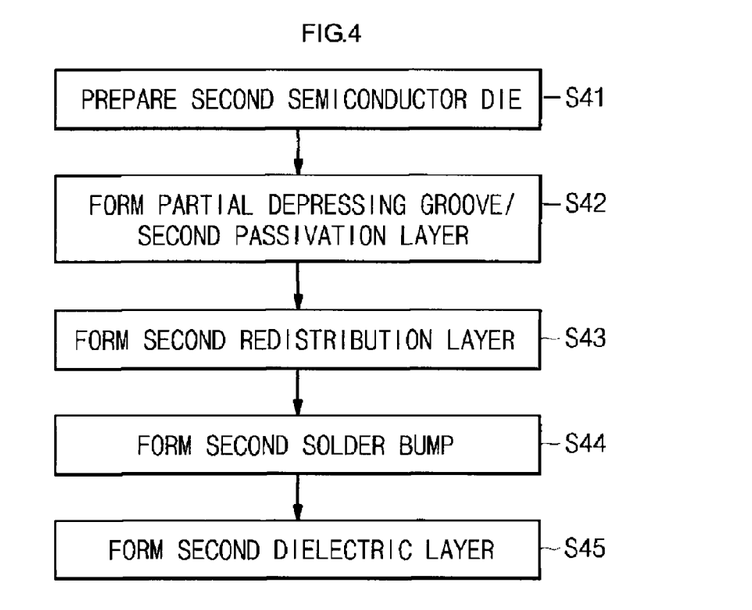
FIG. 4 is a sequential diagram illustrating a preparing operation of the second semiconductor die in a fabricating method of the semiconductor package according to the present invention.

FIG. 4 illustrates a preparing operation of the second semiconductor die in the fabricating method of the semiconductor package according to the present invention.

As illustrated, an embodiment in accordance with the present invention includes an operation S41 of preparing the second semiconductor die, an operation S42 of forming the second insulating passivation layer and partial depression groove, an operation S43 of forming the second redistribution layer, an operation S44 of forming the second solder bump, and an operation S45 of forming the second dielectric layer.

Referring to FIGS. 5a to 5e, the fabricating method of the semiconductor package illustrated in FIG. 4 is illustrated as a cross-sectional view.

Figure 5A:
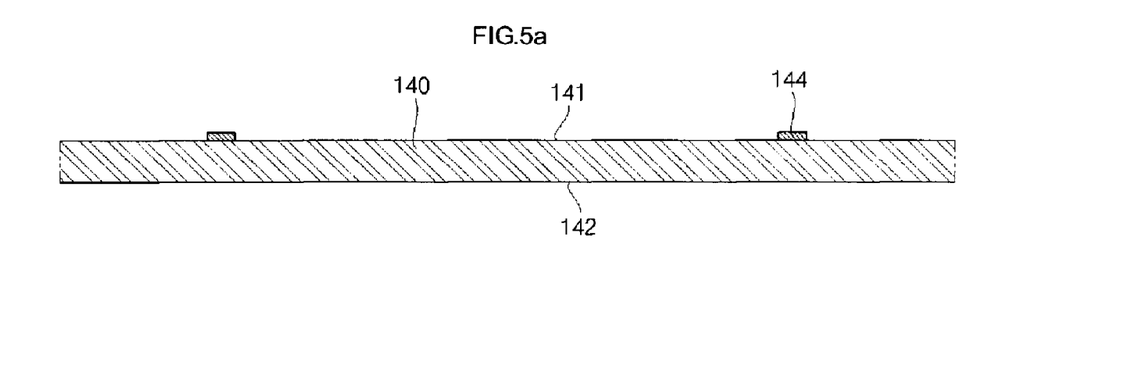
FIGS. 5a to 5e are cross-sectional views illustrating a fabricating method of the semiconductor package illustrated in FIG. 4.

As depicted in FIG. 5a, in the operation S41 of preparing the second semiconductor die, the first surface 141 that is approximately flat or completely flat, and the second surface 142 that is approximately flat or completely flat as an opposite side of the first surface 141 are incorporated, and the second semiconductor die 140 in which at least a bonding pad 144 is formed on the first surface 141 is prepared.

Figure 5B:
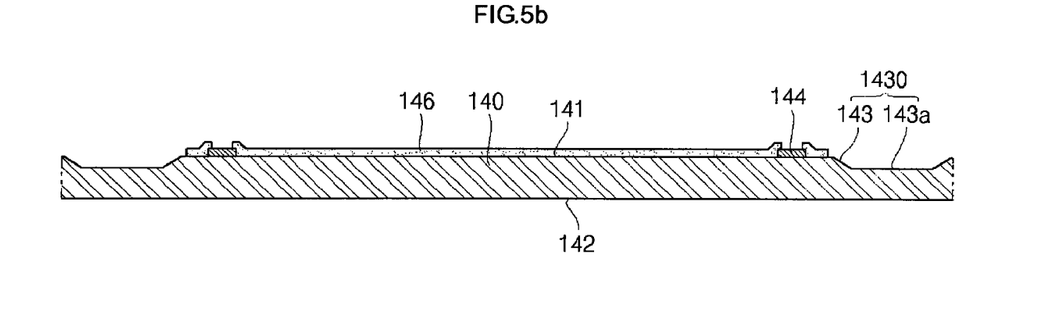

As depicted in FIG. 5b, in the operation S42 of forming the second insulating passivation layer and a partial depressing groove, the partial depressing groove in predetermined thickness is formed in the outer area of the bonding pad 144, and the second insulating passivation layer 146 in predetermined thickness is formed on the first surface 141 so that the bonding pad 144 can be exposed to outside. After forming the second insulating passivation layer 146, then the partial depressing groove 1430 can be formed, the forming order is not limited. The second insulating passivation layer 146 is not formed in the partial depressing groove 1430. The partial depressing groove 1430 can actually be formed using one selected from the photolithography, partial sawing, and its equivalent method, the method is not limited thereto. The third inclined surface 143 and bottom surface 143a are formed in the second semiconductor die 140 by the partial depressing groove 1430. The second insulating passivation layer 146 can be formed using one selected from typical oxide film, nitride film, polyimide, and its equivalent, the material is not limited thereto. The nitride film or oxide film is formed to flow, for example, the silicon gas and nitrogen, the silicon gas and oxygen, and the polyimide can be formed by coating or spray mode.

Figure 5C:
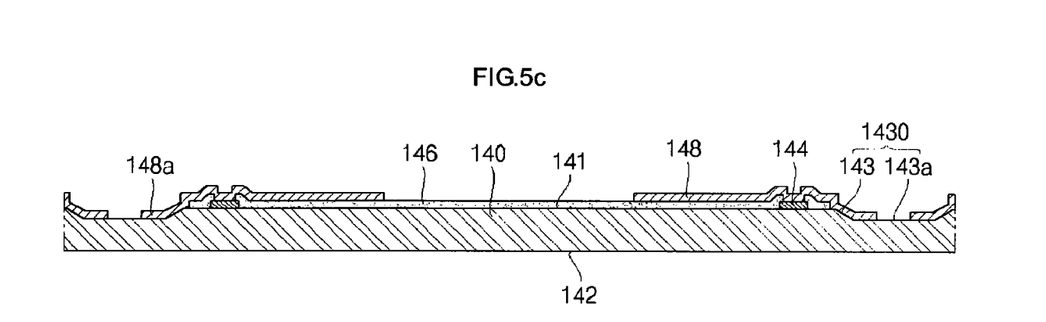

As depicted in FIG. 5c, in the operation S43 of forming the second redistribution layer, the second redistribution layer 148 is formed to be coupled to the bonding pad 144 of the second semiconductor die 140. The second redistribution layer 148 is coupled to the bonding pad 144 actually, and simultaneously, is formed in the third surface 143 and the bottom surface 143a of the partial depression groove 1430 and the second insulating passivation layer 146. More specifically, a plurality of metal layers is formed in the entire upper area of the second semiconductor die 140 to be coupled to the bonding pad 144 of the second semiconductor die 140 using one selected from the sputtering, plating, and its equivalent method. Hereafter, using a typical process of photolithography is formed the second redistribution layer 148 having a predetermined pattern. The second redistribution layer 148 is patterned to be coupled to the bonding pad 144, simultaneously, and to be disposed in the third surface 143 and the second insulating passivation layer 146. The extension pattern 148a is defined as the area formed in the bottom surface 143a of the partial depression groove 1430 of second redistribution layer 148. A plurality of metal layers is called UBM (Under Bumped Metallurgy), and the united type of the metal layer is various. For example, copper Cu for a solder adhesive layer, and titanium Ti, nickel Ni, palladium Pd and the so on for a barrier layer are usable in the second redistribution layer 148, the metal material is not limited thereto.

Figure 5D:
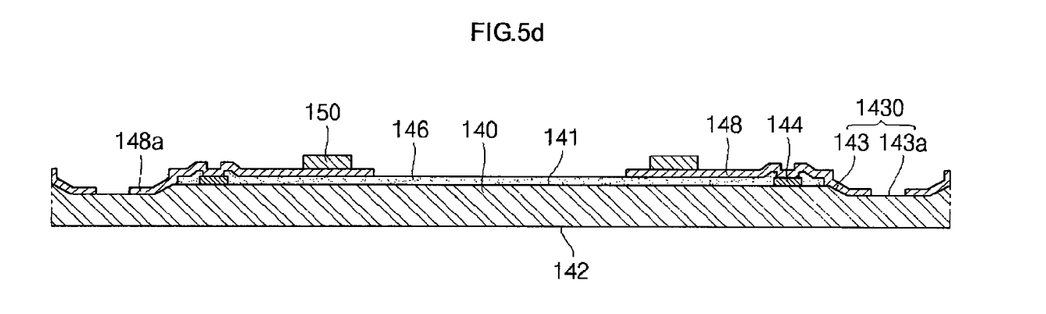

As depicted in FIG. 5d, the second solder bump 150 is formed in the second redistribution layer 148 in the operation S44 of forming the second solder bump. The second solder bump 150 can be formed using one of typical screen printing, plating, and its equivalent method, the method is not limited thereto. The second solder bump 150 can be formed using one selected from typical Pb/Sn, leadless Sn, and its equivalent, the material is not limited thereto.

Figure 5E:
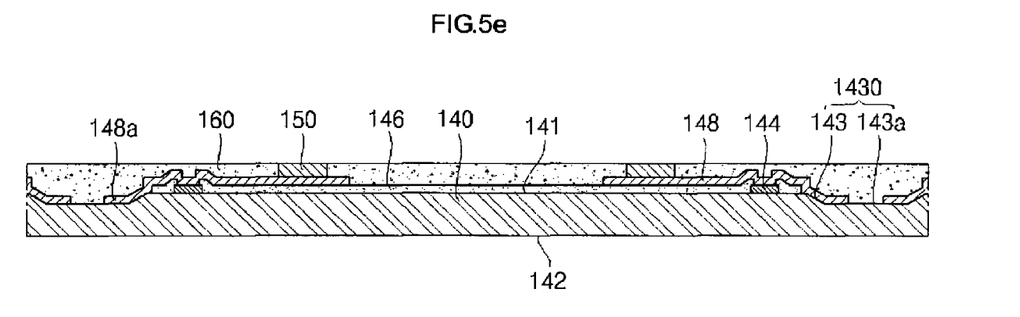

As depicted in FIG. 5e, the first surface 141 of the second semiconductor die 140 is covered with the second dielectric layer 160 in the operation S45 of forming the second dielectric layer. For example, the second dielectric layer 160 can be formed in the partial depression groove 1430 and the first surface 141 of the second semiconductor die 140 using any one of screen printing, spray, spin coating, and its equivalent. The second dielectric layer 160 covers the second redistribution layer 148, the second insulating passivation layer 146 in which the second redistribution layer 148 is not formed, the second surface 142 in which the second insulating passivation layer 146 and the second redistribution layer 148 is not formed and the partial depression groove 1430. The upper surface of the second solder bump 150 is exposed to outside through the second dielectric layer 160, and the second dielectric layer 160 uses the material of B-stage state which is not completely hardened. Likewise, the reason for using the second dielectric layer 160 of B-stage is that the second dielectric layer 160 sticks strongly to the first dielectric layer 130 by the cure process later.

Figure 6:
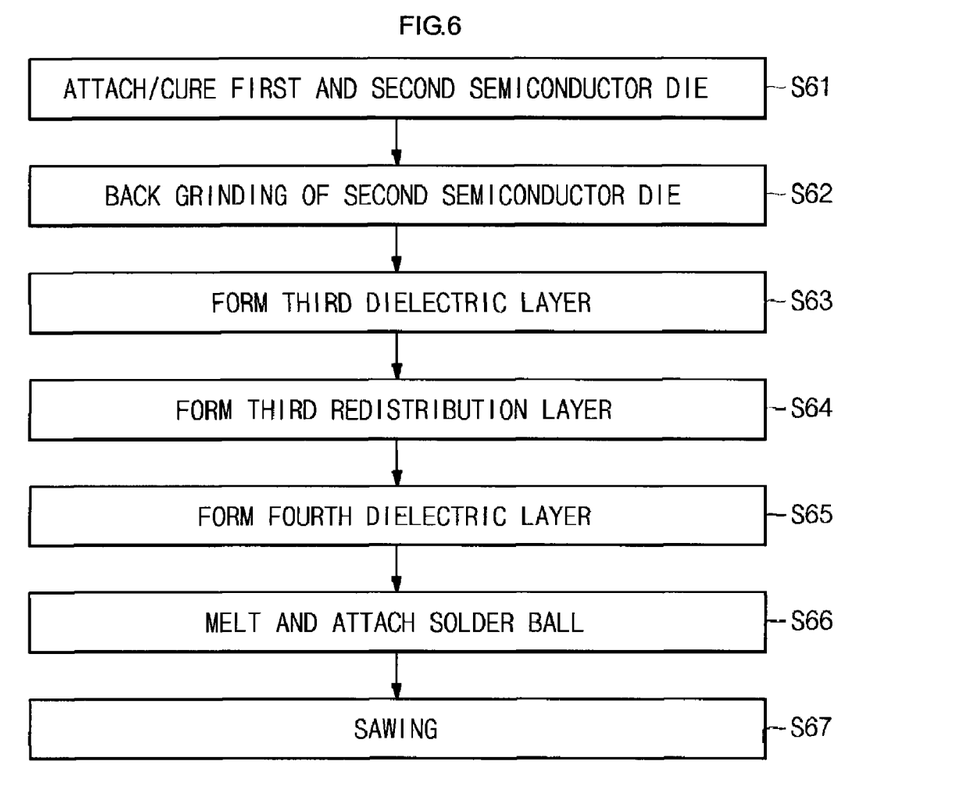
FIG. 6 is a sequential diagram illustrating a stacking operation of a first semiconductor die and a second semiconductor die in a fabricating method of the semiconductor package according to the present invention.

FIG. 6 illustrates an operation of stacking the first semiconductor die and the second semiconductor die in the fabricating method of the semiconductor package according to the present invention.

As illustrated, an embodiment in accordance with the present invention includes an operation S61 of adhering/curing the first semiconductor die and the second semiconductor die, an operation S62 of back-grinding the second semiconductor die, an operation S63 of forming the third dielectric layer, an operation S64 of forming the third redistribution layer, an operation S65 of forming the fourth dielectric layer, an operation S66 of melting/adhering the solder ball, and an operation S67 of sawing.

Referring to FIGS. 7a to 7h, a fabricating method of the semiconductor package illustrated in FIG. 6 is illustrated as a cross-sectional view.

Figure 7A:
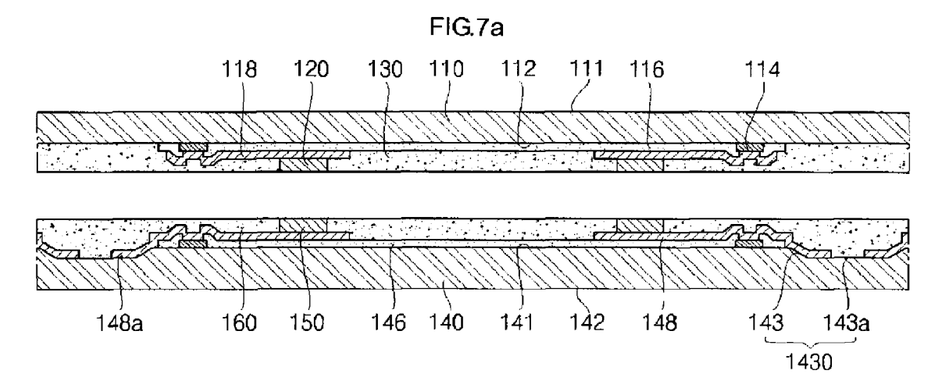
FIGS. 7a to 7h are cross sectional views illustrating a fabricating method of the semiconductor package illustrated in FIG. 6.
Figure 7B:
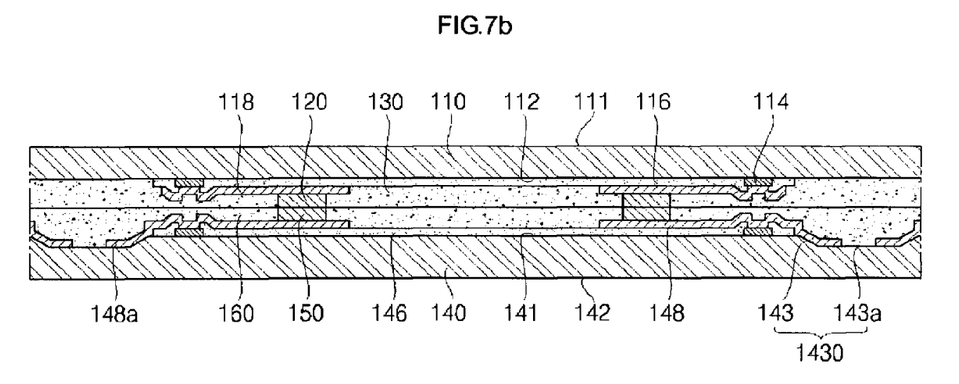

As illustrated in FIGS. 7a and 7b, in the operation S61 of adhering/curing the first semiconductor die and the second semiconductor die, the curing is performed under about 100~300° C. in the state of adhering the first semiconductor die 110 and the second semiconductor die 140 mutually. When the first dielectric layer 130 sticks to the second dielectric layer 160, simultaneously the first solder bump 120 sticks to the second solder bump 150. As described in detail, the first dielectric layer 130 and the second dielectric layer 160 are not yet hardened as the material of B-stage. However, in the case of curing at about 100~300° C. as previously described, the first dielectric layer 130 and the second dielectric layer 160 are hardening and then strongly stuck. The first solder bump 120 and the second solder bump 150 are melted and cooled, then are stuck electrically and mechanically.

Figure 7C:
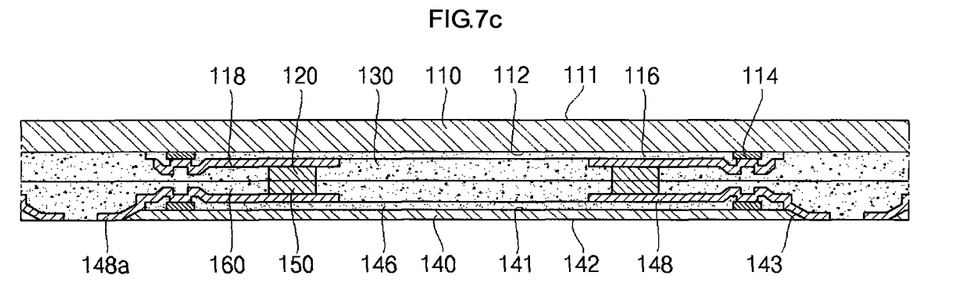

As illustrated in FIG. 7c, the second surface 142 of the second semiconductor die 140 is removed by grinding it as much as the predetermined thickness, in the operation S62 of back grinding the second semiconductor die. The grinding process is performed until the bottom surface 143a is erased in the partial depressing groove 1430 formed in the second semiconductor die 140. As known in the art, such a back grinding process can be performed using, for example, a diamond grinder and its equivalent, the grinding method is not limited thereto. The extension pattern 148a of the second redistribution layer 148 formed in the bottom surface 143a of the partial depressing groove 1430 is exposed to outside, by the grinding process. Likewise, it is very important to expose the extension pattern 148a of the second redistribution layer 148 precisely to the outside because the third redistribution layer 172 is coupled to the extension pattern 148a of the second redistribution layer 148. The symbol of the drawing is not represented as the partial depressing groove 1430 and the bottom surface 143a are removed by grinding in FIG. 7c. Refer to FIG. 7b regarding the symbol 1430 and 143a.

Figure 7D:
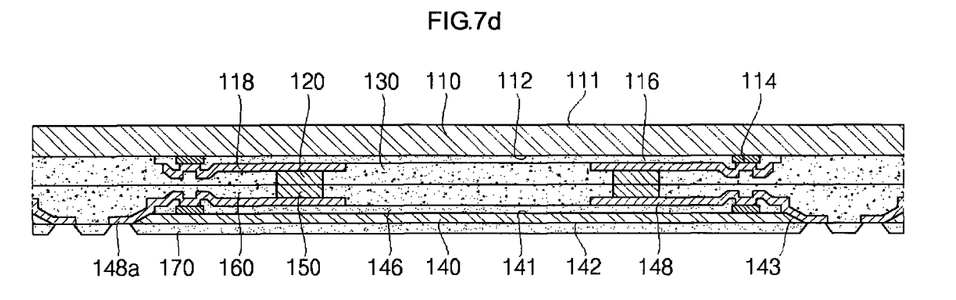

As illustrated in FIG. 7d, a third dielectric layer 170 in the predetermined thickness is formed on the second surface 142 of the second semiconductor die 140 in the operation S63 of forming the third dielectric layer. The second surface 142 of the second semiconductor die 140 means the grinded surface. The third dielectric layer 170 is not formed on the extension pattern 148a of the second redistribution layer 148. Therefore, the extension pattern 148a of the second redistribution layer 148 is exposed to outside through the third dielectric layer 170. The third dielectric layer 170 can be formed by a typical vaporizing method, coating method, and screen printing method, the method is not limited thereto.

Figure 7E:
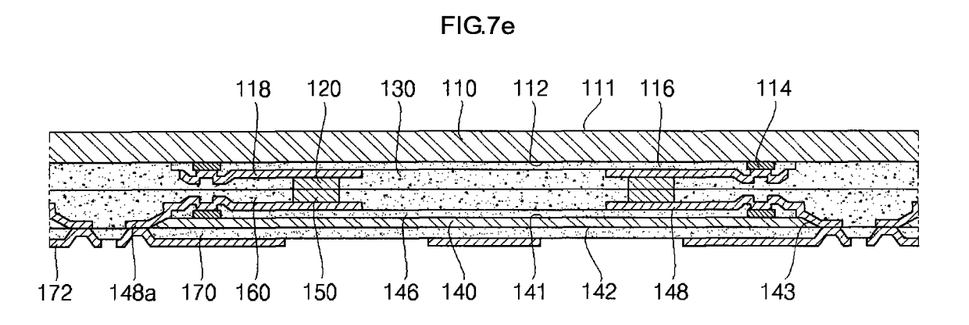

As illustrated in FIG. 7e, in the operation S64 of forming the third redistribution layer, the third redistribution layer 172 is formed to be coupled to the extension pattern 148a of the second redistribution layer 148 exposed through the third dielectric layer 170, and to be disposed in the third dielectric layer 170. More specifically, a plurality of metal layers is formed on the entire third dielectric layer 170 to be coupled to the extension pattern 148a of the second redistribution layer 148 using one selected from the sputtering, plating, and its equivalent method. Hereafter, the third redistribution layer 172 having a predetermined pattern is formed using a typical process of photolithography. Namely, the third redistribution layer 172 is patterned to be coupled to the extension pattern 148a of the second redistribution layer 148, simultaneously, to be disposed on the third dielectric layer 170. A plurality of metal layers is called UBM (Under Bumped Metallurgy), and the united type of the metal layer is various. For example, copper Cu for a solder adhesive layer, and titanium Ti, nickel Ni, palladium Pd and the so on for a barrier layer are used in the third redistribution layer 172, the metal material is not limited thereto.

Figure 7F:
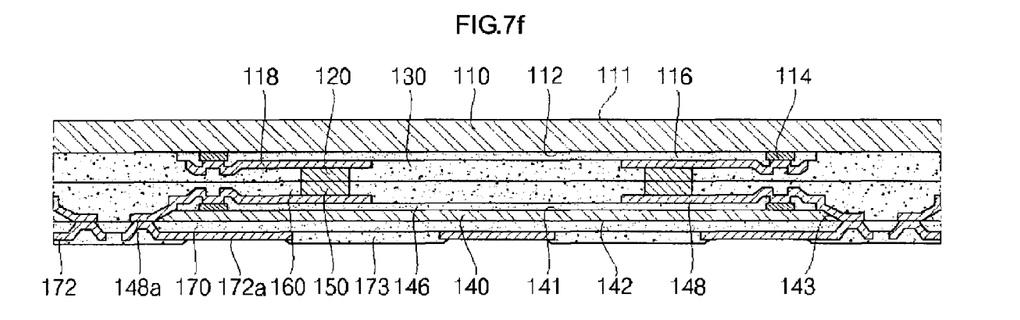

As illustrated in FIG. 7f, in the operation S65 of forming the fourth dielectric layer, the fourth dielectric layer 173 is formed to cover the third redistribution layer 172 and the external side of the third dielectric layer 170. The fourth dielectric layer 173 is not formed to cover the area in which the solder ball 180 is melted and attached to the third redistribution layer 172. The area in which the solder ball 180 is melted and attached is exposed to outside through the fourth dielectric layer 173. The fourth dielectric layer 173 plays a role of protecting the third redistribution layer 172 from exterior circumstances.

Figure 7G:
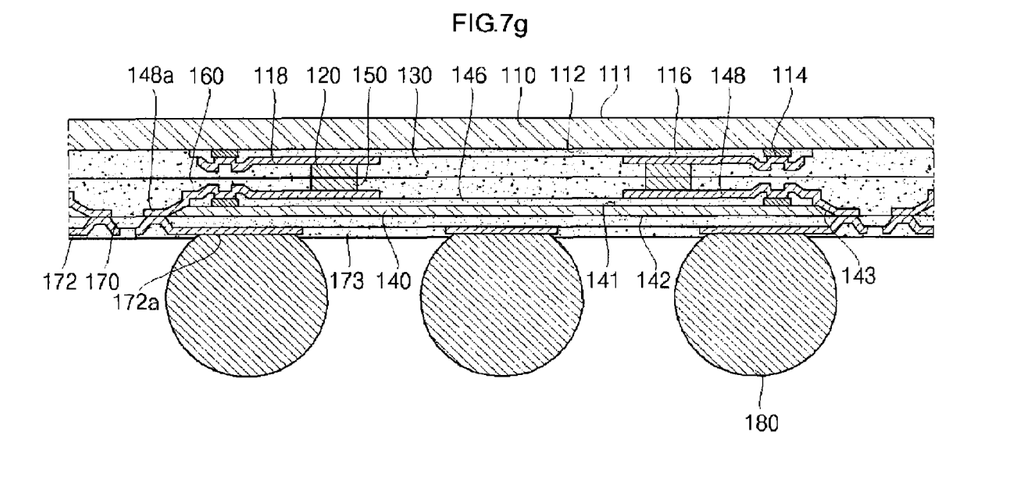

As illustrated in FIG. 7g, the solder ball 180 is melted and stuck to the area exposed to outside through the fourth dielectric layer 173 in the third redistribution layer 172 in the operation S66 of melting/adhering the solder ball. For example, after spraying volatile flux in the exposed area (172a, refer to FIG. 7g), then the solder ball 180 is mounted stably on the exposed area. Hereafter, by inserting and drawing the semiconductor package in the furnace representing the temperature of about 100~300° C., that enables the solder ball 180 to connect to the exposed area electrically and mechanically. All the flux is volatilized and erased in the furnace.

Figure 7H:
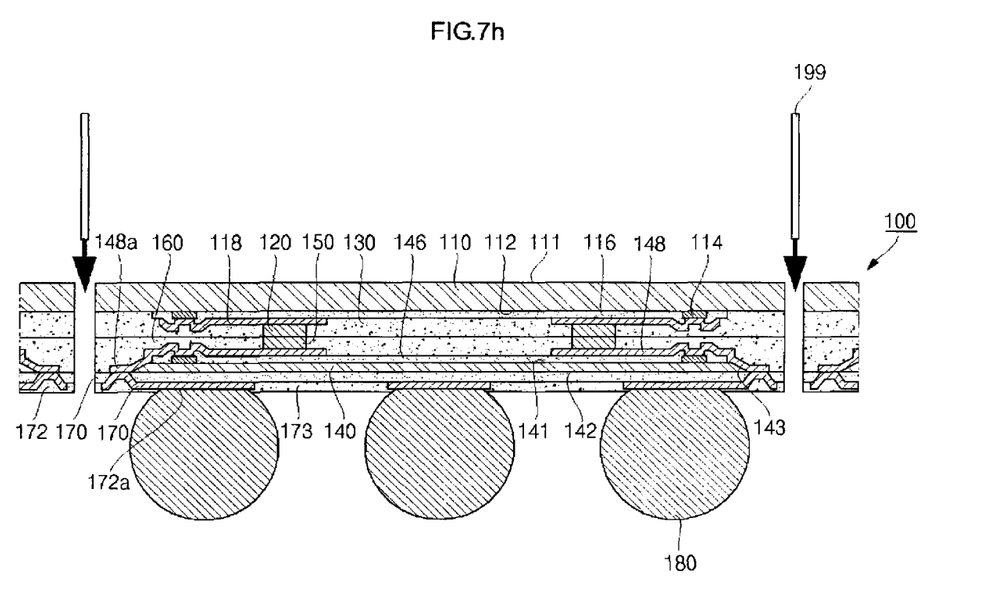

As illustrated in FIG. 7h, a single semiconductor package is sawed in a wafer using a sawing tool such as a diamond wheel or laser beam, in the operation S67 of sawing. For example, a single semiconductor package 100 is separated from the wafer by sawing all the constant area of the first 130, second 160, third 170 and fourth dielectric layer 173 facing the scribe line (not illustrated) in the first semiconductor die 110 using the sawing tool 199. The third surface 113 is formed in the first semiconductor die 110, and respective side surface 131, 161, 170a, 173a is formed in the first dielectric layer 130, second dielectric layer 160, third dielectric layer 170, and fourth dielectric layer 173, by the operation of sawing. Moreover, identical plane is configured by the side surfaces 131, 161, 170a, 173a of the first to the fourth dielectric layer 130, 160, 170, 173 and the third surface 113 of the first semiconductor die 110, by the sawing operation.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and fabricating process, may be implemented by one skilled in the art in view of this disclosure.

What is claimed is:

1. A semiconductor package comprising:
   a first semiconductor die including a first surface, an opposing second surface, and a bonding pad formed on the second surface;
   a first redistribution layer coupled to the bonding pad of the first semiconductor die, the first redistribution layer being disposed on the second surface of the first semiconductor die;
   a first solder bump coupled to the first redistribution layer;
   a second semiconductor die including a first surface, an opposing second surface, and a bonding pad formed on the first surface of the second semiconductor die, wherein the second surface of the second semiconductor die is longer than the first surface of the second semiconductor die, further wherein a third surface of the second semiconductor die connects the first surface of the second semiconductor die and the second surface of the second semiconductor die, and the third surface is slanted to be non-perpendicular to the first surface of the second semiconductor die and the second surface of the second semiconductor die;
   a second redistribution layer coupled to the bonding pad of the second semiconductor die, the second redistribution layer being disposed on the first surface of the second semiconductor die;
   a second solder bump coupled to the second redistribution layer and coupled to the first solder bump;
   a third redistribution layer coupled to the second redistribution layer, the third redistribution layer being disposed on the second surface of the second semiconductor die; and
   a solder ball coupled to the third redistribution layer.

2. The semiconductor package as claimed in claim 1, wherein a first passivation layer is further interposed between the first redistribution layer and the second surface of the first semiconductor die.

3. The semiconductor package as claimed in claim 1, wherein a first dielectric layer covering the first redistribution layer is further formed on the second surface of the first semiconductor die.

4. The semiconductor package as claimed in claim 3, wherein a third surface of the first semiconductor die connects the first surface of the first semiconductor die and the second surface of the first semiconductor die, a side surface configuring the identical plane with the third surface is further formed in the first dielectric layer.

5. The semiconductor package as claimed in claim 2, wherein a second passivation layer is further interposed between the second redistribution layer and the first surface of the second semiconductor die.

6. The semiconductor package as claimed in claim 3, wherein a second dielectric layer covering the second redistribution layer is further formed on the first surface of the second semiconductor die.

7. The semiconductor package as claimed in claim 1, wherein a first dielectric layer covering the first redistribution layer is formed on the second surface of the first semiconductor die, a second dielectric layer covering the second redistribution layer is formed on the first surface of the second semiconductor die, the first dielectric layer being attached to the second dielectric layer.

8. The semiconductor package as claimed in claim 1, wherein a third surface of the first semiconductor die connects the first surface of the first semiconductor die and the second surface of the first semiconductor die, a first dielectric layer covering the first redistribution layer is formed on the second surface of the first semiconductor die, a side surface configuring the identical plane with the third surface of the first semiconductor die is formed in the first dielectric layer, a second dielectric layer covering the second redistribution layer is formed on the first surface of the second semiconductor die, a side surface configuring the identical plane with the side surface of the first dielectric layer is formed in the second dielectric layer.

9. The semiconductor package as claimed in claim 1, wherein the width of the second semiconductor die is smaller than that of the first semiconductor die.

10. The semiconductor package as claimed in claim 1, wherein the second redistribution layer is formed over the first surface of the second semiconductor die and the third surface of the second semiconductor die.

11. The semiconductor package as claimed in claim 10, wherein the second redistribution layer further includes an extension pattern extended in a length to outside of the third surface in the second semiconductor die.

12. The semiconductor package as claimed in claim 11, wherein the third redistribution layer is coupled to the extension pattern of the second redistribution layer.

13. The semiconductor package as claimed in claim 12, wherein a dielectric layer is further interposed between the third redistribution layer and the second surface of the second semiconductor die.

14. The semiconductor package as claimed in claim 1, wherein a dielectric layer is further formed on the third redistribution layer.

15. A semiconductor package comprising:
a first semiconductor die including a first surface, an opposing second surface, and a bonding pad formed on the second surface;
a first redistribution layer coupled to the bonding pad of the first semiconductor die, the first redistribution layer being disposed on the second surface of the first semiconductor die;
a first solder bump coupled to the first redistribution layer;
a second solder bump coupled to the first solder bump;
a second redistribution layer coupled to the second solder bump;
a second semiconductor die including a first surface, an opposing second surface, and a bonding pad formed on the first surface of the second semiconductor die, the bonding pad of the second semiconductor die being coupled to the second redistribution layer, the second redistribution layer being disposed on the first surface of the second semiconductor die;
a third redistribution layer directly connected to the second redistribution layer, the third redistribution layer being disposed on the second surface of the second semiconductor die; and
a solder ball coupled to the third redistribution layer, wherein a third surface of the second semiconductor die connects the first surface of the second semiconductor die and the second surface of the second semiconductor die, and wherein the second redistribution layer further includes an exposed extension pattern extended in a length to beyond the third surface in the second semiconductor die and a covered portion, the third redistribution layer being directly connected to the exposed extension pattern of the second redistribution layer.

16. The semiconductor package of claim 15 wherein the third surface is slanted to be non-perpendicular to the first surface of the second semiconductor die and the second surface of the second semiconductor die.

17. A semiconductor package comprising:
a first semiconductor die including a first surface, an opposing second surface, and a bonding pad formed on the second surface;
a first redistribution layer coupled to the bonding pad of the first semiconductor die, the first redistribution layer being disposed on the second surface of the first semiconductor die;
a first passivation layer interposed between the first redistribution layer and the second surface of the first semiconductor die;
a first dielectric layer covering the first redistribution layer formed on the second surface of the first semiconductor die;
a first solder bump coupled to the first redistribution layer;
a second semiconductor die including a first surface, an opposing second surface, and a bonding pad formed on the first surface of the second semiconductor die;
a second redistribution layer coupled to the bonding pad of the second semiconductor die, the second redistribution layer being disposed on the first surface of the second semiconductor die;
a second passivation layer interposed between the second redistribution layer and the first surface of the second semiconductor die;
a second dielectric layer covering the second redistribution layer formed on the first surface of the second semiconductor die, the second dielectric layer being attached to the first dielectric layer;
a second solder bump coupled to the second redistribution layer and coupled to the first solder bump;
a third redistribution layer directly connected to an exposed extension pattern of the second redistribution layer, the second redistribution layer further comprising a covered portion, the third redistribution layer being disposed on the second surface of the second semiconductor die;

a third dielectric layer interposed between the third redistribution layer and the second surface of the second semiconductor die;

a fourth dielectric layer formed on the third redistribution layer; and a solder ball coupled to the third redistribution layer.

18. The semiconductor package of claim 17 wherein a third surface of the first semiconductor die, a side surface of the first dielectric layer, a side surface of the second dielectric layer, a side surface of the third dielectric layer, and a side surface of the fourth dielectric layer form an identical plane.

* * * * *